(12) United States Patent
Suzuki et al.

(10) Patent No.: US 9,130,071 B2
(45) Date of Patent: Sep. 8, 2015

(54) SOLID-STATE IMAGE SENSOR, METHOD FOR MANUFACTURING THE SAME, AND CAMERA

(71) Applicant: CANON KABUSHIKI KAISHA, Tokyo (JP)

(72) Inventors: Kentarou Suzuki, Kawasaki (JP); Yusuke Onuki, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/325,806

(22) Filed: Jul. 8, 2014

(65) Prior Publication Data

US 2014/0313384 A1   Oct. 23, 2014

Related U.S. Application Data

(63) Continuation of application No. 13/911,350, filed on Jun. 6, 2013, now Pat. No. 8,809,914.

(30) Foreign Application Priority Data

Jun. 15, 2012  (JP) .................................. 2012-136305

(51) Int. Cl.
```
H01L 31/02      (2006.01)
H01L 31/18      (2006.01)
H04N 5/369      (2011.01)
H01L 31/0224    (2006.01)
H01L 31/0232    (2014.01)
H01L 27/146     (2006.01)
```

(52) U.S. Cl.
CPC .... *H01L 31/02019* (2013.01); *H01L 27/14609* (2013.01); *H01L 27/14643* (2013.01); *H01L 27/14689* (2013.01); *H01L 31/02325* (2013.01); *H01L 31/18* (2013.01); *H01L 31/1876* (2013.01); *H04N 5/369* (2013.01)

(58) Field of Classification Search
None
See application file for complete search history.

(56) References Cited

U.S. PATENT DOCUMENTS

| | | | |
|---|---|---|---|
| 6,040,593 A * | 3/2000 | Park | 257/292 |
| 6,333,205 B1 | 12/2001 | Rhodes | |
| 7,358,552 B2 * | 4/2008 | Lee | 257/292 |
| 8,093,635 B2 | 1/2012 | Kido et al. | |
| 8,410,533 B2 * | 4/2013 | Katayama | 257/292 |
| 8,586,404 B2 * | 11/2013 | Huang et al. | 438/98 |
| 8,809,914 B2 * | 8/2014 | Suzuki et al. | 257/232 |
| 2003/0137008 A1 * | 7/2003 | Nozaki et al. | 257/347 |
| 2006/0125007 A1 * | 6/2006 | Rhodes | 257/346 |
| 2006/0275945 A1 * | 12/2006 | Yang et al. | 438/73 |

(Continued)

FOREIGN PATENT DOCUMENTS

| | | |
|---|---|---|
| JP | 2010-056515 A | 3/2010 |
| JP | 2011-243474 A | 12/2011 |

*Primary Examiner* — Joseph Schoenholtz
(74) *Attorney, Agent, or Firm* — Fitzpatrick, Cella, Harper & Scinto

(57) ABSTRACT

A method for manufacturing a solid-state image sensor having a pixel region, a peripheral circuit region, and an intermediate region interposed between the pixel region and the peripheral circuit region, includes forming a high melting point metal compound in active regions of the peripheral circuit region and the intermediate region, forming an etch stop film on the high melting point metal compound formed in the active regions of the peripheral circuit region and the intermediate region, forming an interlayer insulating film on the etch stop film, and forming, by using the etch stop film, a contact plug to contact the high melting point metal compound in the active region of the peripheral circuit region.

20 Claims, 16 Drawing Sheets

(56) References Cited

U.S. PATENT DOCUMENTS

| | | | |
|---|---|---|---|
| 2009/0239327 A1* | 9/2009 | Oh et al. | 438/59 |
| 2010/0026866 A1 | 2/2010 | Matsumoto et al. | |
| 2010/0091163 A1* | 4/2010 | Liao et al. | 348/308 |
| 2010/0140675 A1* | 6/2010 | Rhodes | 257/292 |

* cited by examiner

SOLID-STATE IMAGE SENSOR, METHOD FOR MANUFACTURING THE SAME, AND CAMERA

CROSS-REFERENCE TO RELATED APPLICATIONS

This application is a continuation application of application Ser. No. 13/911,350, filed Jun. 6, 2013, which claims the benefit of Japanese Patent Application No. 2012-136305, filed Jun. 15, 2012. Both of these applications are incorporated herein by reference in their entirety.

BACKGROUND OF THE INVENTION

1. Field of the Invention

The present invention relates to a solid-state image sensor, a method for manufacturing the same, and a camera.

2. Description of the Related Art

Japanese Patent Laid-Open No. 2010-56515 discloses a method of siliciding the gate electrode, source region, and drain region of a peripheral circuit portion while not siliciding those of a pixel portion. Japanese Patent Laid-Open No. 2011-243474 also discloses a similar method. Siliciding the gate electrode, source region, and drain region of the peripheral circuit portion can increase the operation speed of a MOS transistor in the peripheral circuit portion. In addition, not siliciding the gate electrode, source region, and drain region of the pixel portion can suppress a white spot and an increase in dark current.

However, Japanese Patent Laid-Open Nos. 2010-56515 and 2011-243474 do not consider how to design the boundary or intermediate region between the peripheral circuit portion (peripheral circuit region) and the pixel portion (pixel region).

SUMMARY OF THE INVENTION

The present inventors have found out that a silicide is sometimes exposed during the manufacturing process in the boundary or intermediate region between the peripheral circuit portion (peripheral circuit region) and the pixel portion (pixel region), and it peels off and becomes a particle. This decreases the yield.

The present invention provides a technique advantageous for increasing the yield.

One of the aspects of the present invention provides a method for manufacturing a solid-state image sensor in which a pixel region, a peripheral circuit region arranged to surround at least part of the pixel region, and an intermediate region interposed between the pixel region and the peripheral circuit region are arranged on a semiconductor substrate, the method comprising the steps of: forming a high melting point metal compound in an active region of the peripheral circuit region and an active region of the intermediate region out of an active region of the pixel region, the active region of the peripheral circuit region, and the active region of the intermediate region; forming an etch stop film on the high melting point metal compound formed in the active region of the peripheral circuit region and the high melting point metal compound formed in the active region of the intermediate region; forming an interlayer insulating film on the etch stop film while the etch stop film covers the high melting point metal compound formed in the active region of the intermediate region; and forming a contact plug to contact the high melting point metal compound in the active region of the peripheral circuit region out of the active region of the pixel region, the active region of the peripheral circuit region, and the active region of the intermediate region, the step of forming a contact plug including the step of forming a contact hole by using the etch stop film.

Further features of the present invention will become apparent from the following description of exemplary embodiments with reference to the attached drawings.

DESCRIPTION OF THE EMBODIMENTS

A preferred embodiment of the present invention will now be described with reference to the accompanying drawings. A case in which a silicide is used to increase the operation speed of a transistor will be exemplified. However, the present invention is not limited to this, and it suffices to form a compound (high melting point metal compound) of a material forming an active region, and a high melting point metal. Examples of a semiconductor material forming an active region are silicon and gallium arsenide. Examples of the high melting point metal are cobalt, tungsten, and titanium. As for an etch stop film, a case in etching stops at the etch stop film will be explained. However, etching need not completely stop, and it is only necessary to decrease the etching rate by arranging a low-etching-rate film for a film to be etched.

Figure 1:
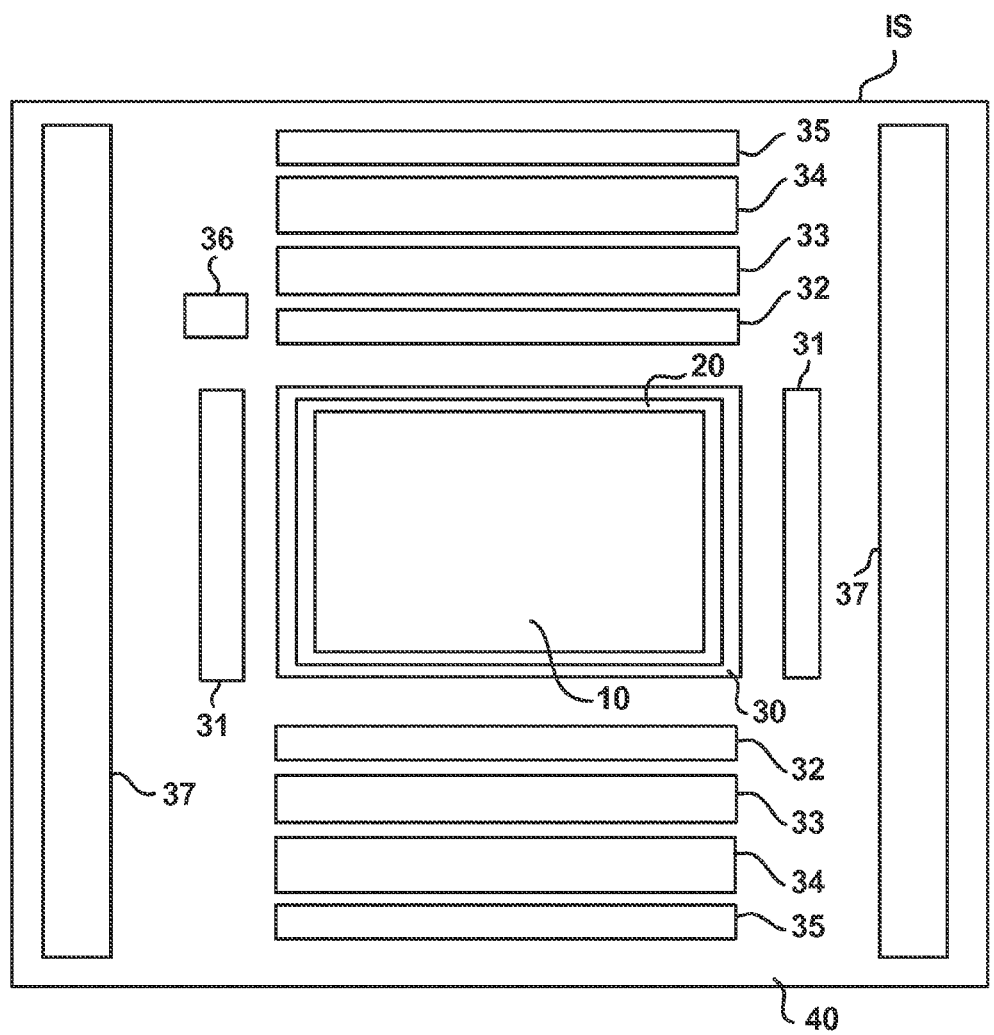
FIG. 1 is a plan view schematically showing the arrangement of a solid-state image sensor according to an embodiment of the present invention.
Figure 2:
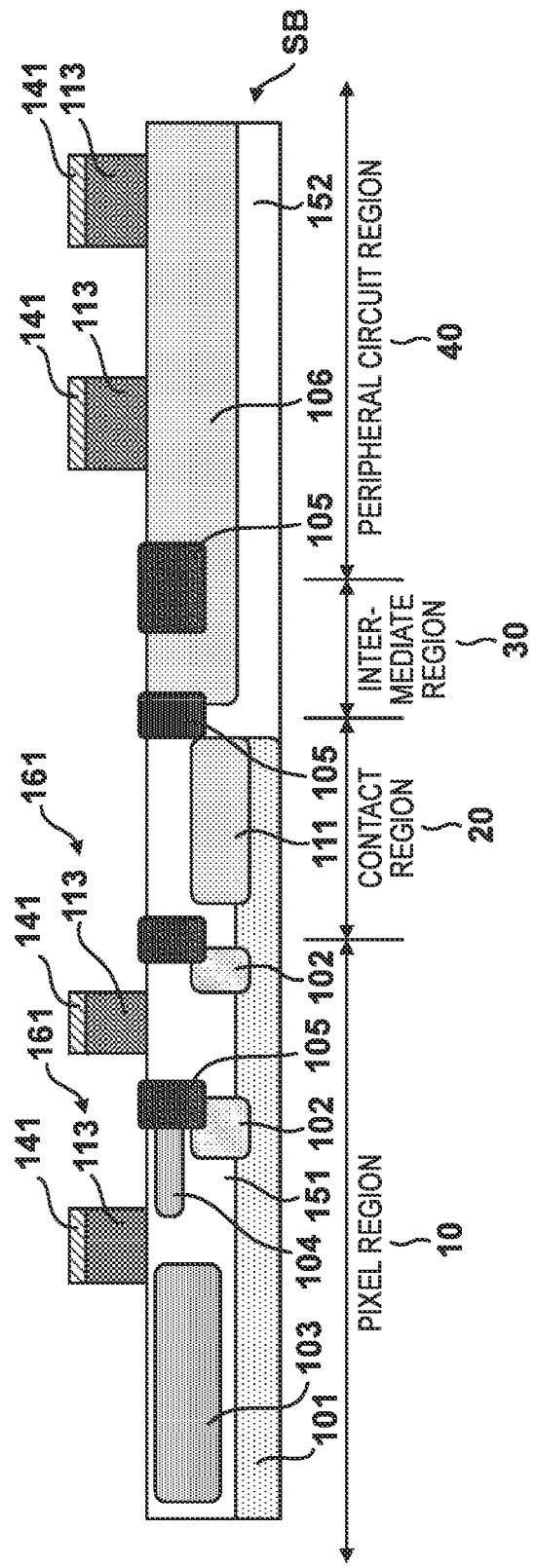
FIGS. 2 to 15 are sectional views for explaining a method for manufacturing the solid-state image sensor according to the embodiment of the present invention.

FIG. 1 is a plan view schematically showing the arrangement of a solid-state image sensor IS according to an embodiment of the present invention. The solid-state image sensor IS includes a pixel region 10, intermediate region 30, and peripheral circuit region 40. The pixel region 10, intermediate region 30, and peripheral circuit region 40 are arranged on a semiconductor substrate. The pixel region 10 is a region where a plurality of pixels are arrayed to form a plurality of rows and a plurality of columns. Each pixel includes a photoelectric converter. Each pixel can further include a floating diffusion, transfer gate, amplifier transistor, and reset transistor. The transfer gate forms a channel for transferring charges generated in the photoelectric converter to the floating diffusion. The amplifier transistor outputs a signal corresponding to the electric potential of the floating diffusion to a column signal line. The reset transistor resets the electric potential of the floating diffusion. The floating diffusion, amplifier transistor, and reset transistor may be shared between a plurality of pixels. As for a selection operation for each pixel, a selector transistor may be arranged, or the selection and non-selection states may be implemented by switching the electric potential of the floating diffusion by the reset transistor.

The peripheral circuit region 40 is a region arranged around the pixel region 10. In the peripheral circuit region 40, a circuit for controlling the operation of the pixel arranged in the pixel region 10, a circuit for processing a signal read out from the pixel, and the like can be arranged. More specifically, in the peripheral circuit region 40, a vertical scanning circuits 31, horizontal scanning circuits 32, column amplifiers 33, column AD (analog-to-digital) converters 34, memories 35, a timing generation circuit 36, and pad portions 37 can be arranged. The vertical scanning circuit 31 selects a row in the pixel region 10. The column amplifier 33 amplifies a signal to be output to the column signal line of the pixel region 10. The column AD converter 34 converts an analog pixel signal output from the column amplifier 33 into a digital signal. The memory 35 holds a digital signal output from the column AD converter 34. The horizontal scanning circuit 32 selects and reads out a signal held in the memory. The timing generation circuit 36 generates signals for controlling the vertical scanning circuit 31, horizontal scanning circuit 32, column amplifier 33, column AD converter 34, and memory 35.

The intermediate region 30 is a region interposed between the pixel region 10 and the peripheral circuit region 40. In the intermediate region 30, no circuit element is arranged, and even a contact plug is not arranged. A contact region 20 where a contact plug for suppressing fluctuations of the electric potential of a semiconductor layer arranged in the pixel region 10 and desirably fixing the electric potential can be interposed between the pixel region 10 and the intermediate region 30. More specifically, the semiconductor layer is a well which provides the channel of the transistor of the pixel. The contact region 20 suppresses fluctuations of the electric potential of the well by supplying a reference voltage to the well.

Active regions are formed in the pixel region 10, contact region 20, intermediate region 30, and peripheral circuit region 40. No silicide is formed in the active regions of the pixel region 10 and contact region 20, and a silicide is formed in those of the peripheral circuit region 40 and intermediate region 30. The active region of the peripheral circuit region 40 is covered with an etch stop film, and a contact plug is connected through an opening formed in the etch stop film. The entire active region of the intermediate region 30 is covered with an etch stop film.

Figure 14:
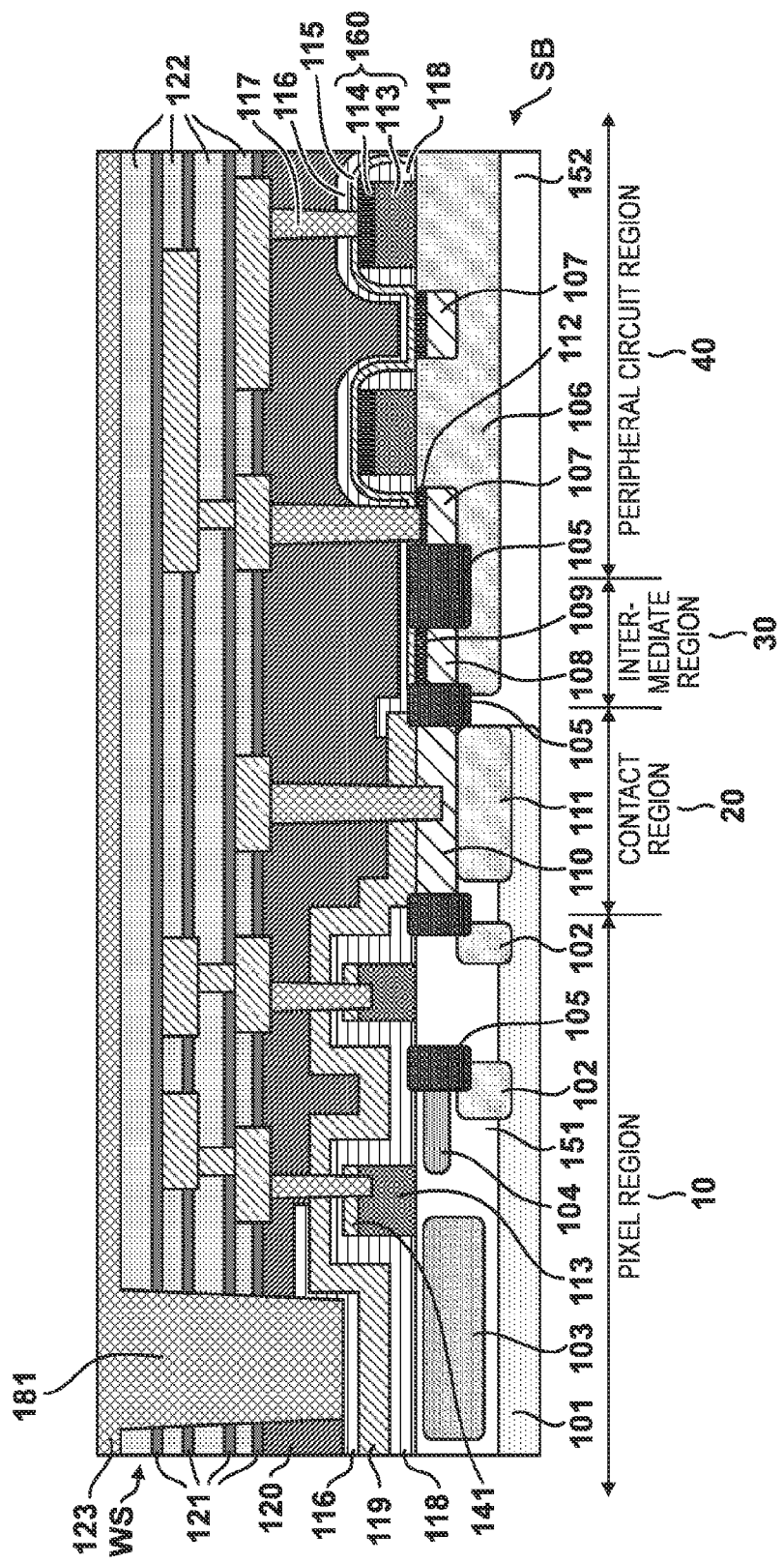
Figure 15:
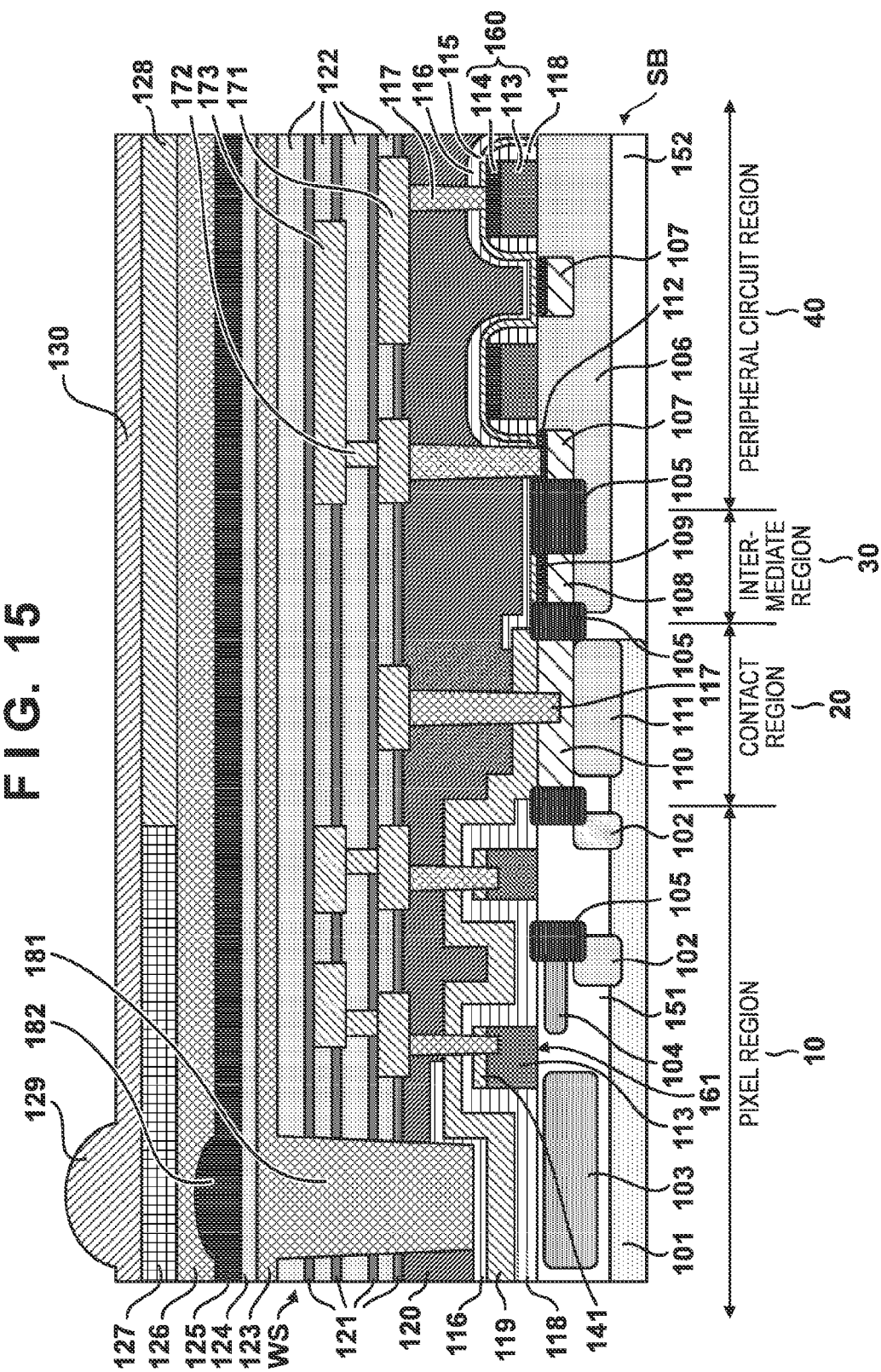

FIG. 15 is a schematic sectional view showing the arrangement of the solid-state image sensor IS. The solid-state image sensor IS is formed on a semiconductor substrate SB including impurity semiconductor regions 151 and 152 of the first conductivity type. FIG. 15, and FIGS. 2 to 14 to be referred to later show part of the semiconductor substrate SB.

In the semiconductor substrate SB, element isolations 105 are formed to isolate elements such as MOS transistors from each other. The element isolation 105 can be STI or LOCOS. A region on the surface of the semiconductor substrate SB where no element isolation 105 exists is an active region. As described above, active regions exist in the pixel region 10, contact region 20, intermediate region 30, and peripheral circuit region 40, respectively.

The pixel region 10 can include a buried semiconductor layer 101, a semiconductor region 103 which forms a photoelectric converter, a floating diffusion 104, and a semiconductor region 102. The semiconductor region 103 and floating diffusion 104 can be formed from semiconductor regions of the first conductivity type. The buried semiconductor layer 101 and semiconductor region 102 can be formed from semiconductor regions of the second conductivity type. The first and second conductivity types are different from each other. When the first conductivity type is the n type, the second conductivity type is the p type. When the first conductivity type is the p type, the second conductivity type is the n type.

In the pixel region 10, a plurality of gate electrodes 161 are arranged. The gate electrodes 161 can include, for example, a transfer gate electrode, the gate electrode of the amplifier transistor, and that of the reset transistor. Insulating films 141 can be arranged on the gate electrodes 161. The insulating film 141 can be a silicon oxide film. The gate electrode 161 can be formed from a polysilicon pattern 113.

The active region of the pixel region 10, the gate electrodes 161, and the element isolations 105 can be covered with an insulating film 118. The insulating film 118 can be covered with an insulating film 119. The insulating film 118 can be a silicon nitride film. The insulating film 119 can be a silicon oxide film. In a region where the semiconductor region (photoelectric converter) 103 is arranged, an etch stop film 116 can be arranged on the insulating film 119. The etch stop film 116 and insulating film 119 are covered with an interlayer insulating film 120. A wiring structure WS is arranged on the interlayer insulating film 120. The wiring structure WS includes wiring layers 171 and 173, vias 172, and an interlayer insulating film. The interlayer insulating film can have a multilayered structure of, for example, insulating films 121 and 122. The insulating films 121 and 122 can be a silicon nitride film and silicon oxide film, respectively. A material forming the wiring of each wiring layer is preferably copper. In this case, the vias 172 can be formed by a dual damascene method using copper which is the wiring material. In the example of FIG. 15, the number of wiring layers is two in each of the pixel region 10 and peripheral circuit region 40. However, a larger number of wiring layers may be arranged. Further, the number of wiring layers may be changed between the pixel region 10 and the peripheral circuit region 40. A larger number of wiring layers is preferably arranged in the peripheral circuit region 40 than in the pixel region 10.

A lightguide 181 for guiding light to the semiconductor region 103 can be arranged on the semiconductor region (photoelectric converter) 103. The lightguide 181 can be formed by a step of forming a lightguide opening by etching the wiring structure WS and interlayer insulating film 120 so that etching stops at a pattern of the etch stop film 116 that is arranged in the pixel region 10, and a step of filling the lightguide opening with an insulator. This pattern of the etch stop film 116 has a partial region in contact with the lower face of the lightguide 181, and another partial region in contact with the interlayer insulating film 120. When filling the lightguide opening with the insulator, an insulating film 123 can be formed in a region other than the lightguide opening. The lightguide 181 and insulating film 123 can be made of, for example, silicon nitride.

The contact region 20 can include a semiconductor region 110 of the second conductivity type, and a semiconductor region 111 of the second conductivity type which electrically connects the semiconductor region 110 and the buried semiconductor layer 101. A contact plug 117 is electrically connected to the semiconductor region 110, and the contact plug 117 and buried semiconductor layer 101 are electrically connected through the semiconductor regions 110 and 111. This structure can fix the electric potential of the buried semiconductor layer 101. The buried semiconductor layer 101 spreads in the entire pixel region 10.

The intermediate region 30 can include a well 106 of the first conductivity type, a semiconductor region 108 of the second conductivity type formed in the well 106, and a silicide film 109 arranged on the semiconductor region 108. Although not shown, the intermediate region 30 can include a well of the second conductivity type, a semiconductor region of the first conductivity type formed in the well, and a silicide film arranged on the semiconductor region.

The active region of the intermediate region 30, that is, the region where the silicide film 109 is formed is entirely covered with the etch stop film 116. An insulating film 115 can be interposed between the etch stop film 116 and the silicide film 109. The insulating film 115 is useful for relaxing a stress generated between the etch stop film 116 and the silicide film 109. The etch stop film 116 is used when forming the active region of the peripheral circuit region 40, that is, the contact plug 117 which contacts a silicide film 112.

The peripheral circuit region 40 can include the well 106 of the first conductivity type, semiconductor regions 107 of the second conductivity type formed in the well 106, and the silicide film 112 arranged on each semiconductor region 107. Although not shown, the peripheral circuit region 40 can include a well of the second conductivity type, semiconductor regions of the first conductivity type formed in the well, and a silicide film arranged on each semiconductor region. The semiconductor regions 107 can form the diffusion regions (source and drain regions) of a MOS transistor.

The active region of the peripheral circuit region 40, that is, the region where the silicide film 112 is formed is covered with the etch stop film 116, and the contact plug 117 is connected through an opening formed in the etch stop film 116. In the peripheral circuit region 40, gate electrodes 160 are arranged. Each gate electrode 160 can form a MOS transistor together with the semiconductor regions 107. The gate electrode 160 includes the polysilicon pattern 113, and a silicide film 114 arranged on it. The silicide film 114 is covered with the etch stop film 116, and the contact plug 117 is connected through the opening formed in the etch stop film 116. The insulating film 115 can be interposed between the etch stop film 116 and the silicide film 112, and between the etch stop film 116 and the silicide film 114. The insulating film 115 is useful for relaxing a stress generated between the etch stop film 116 and the silicide films 112 and 114.

A step of forming the contact plug 117 which contacts the silicide film 112 formed in the active region of the peripheral circuit region 40 can include a contact hole forming step and filling step. In the contact hole forming step, an opening is formed by etching the interlayer insulating film 120 so that etching stops at the etch stop film 116, and then the etch stop film 116 is etched through the opening, forming a contact hole. In the filling step, the contact hole is filled with a conductor.

The etch stop film 116 arranged in the intermediate region 30 and peripheral circuit region 40, and the etch stop film 116 arranged in the pixel region 10 can be formed by the same step. In other words, the etch stop film 116 arranged in the intermediate region 30 and peripheral circuit region 40, and the etch stop film 116 arranged in the pixel region 10 can be made of the same material, and have the same thickness at flat portions. The etch stop film 116 is not arranged in the contact region 20.

An insulating film 124 can be arranged on the lightguide 181 and insulating film 123. The insulating film 124 can be made of, for example, silicon oxide. An intra-layer lens 182 formed from an insulating film 125 can be arranged on the insulating film 124. The insulating film 125 can be made of, for example, silicon nitride. A planarizing film 126 can be arranged on the insulating film 125. Color filters 127 and 128 can be arranged on the planarizing film 126. The color filter 127 arranged in the pixel region 10 is a color filter corresponding to a color assigned to a pixel. The color filter 128 is preferably arranged in the contact region 20, intermediate region 30, and peripheral circuit region 40. The color filter 128 is preferably a B color filter in the RGB color filter arrangement. A microlens layer 130 including a microlens 129 can be arranged on a layer in which the color filters 127 and 128 are arranged.

A method for manufacturing the solid-state image sensor IS will be exemplified with reference to FIGS. 2 to 15. In a step shown in FIG. 2, a buried semiconductor layer 101, semiconductor regions 102, a semiconductor region 103, a floating diffusion 104, a well 106, and element isolations 105 are formed in a semiconductor substrate SB. Although not shown, a semiconductor region of the second conductivity type may be formed below the polysilicon pattern 113 serving as a transfer gate electrode to suppress punch-through between the photoelectric converter and the floating diffusion. Also, in the step shown in FIG. 2, polysilicon patterns 113 are formed on a gate insulating film (not shown) on the semiconductor substrate SB. The polysilicon pattern 113 can be formed by forming a polysilicon layer on a gate insulating film, forming a hard mask from an insulating film 141 on the polysilicon layer, and then etching the polysilicon layer by using the insulating film 141 as an etching mask.

Figure 3:
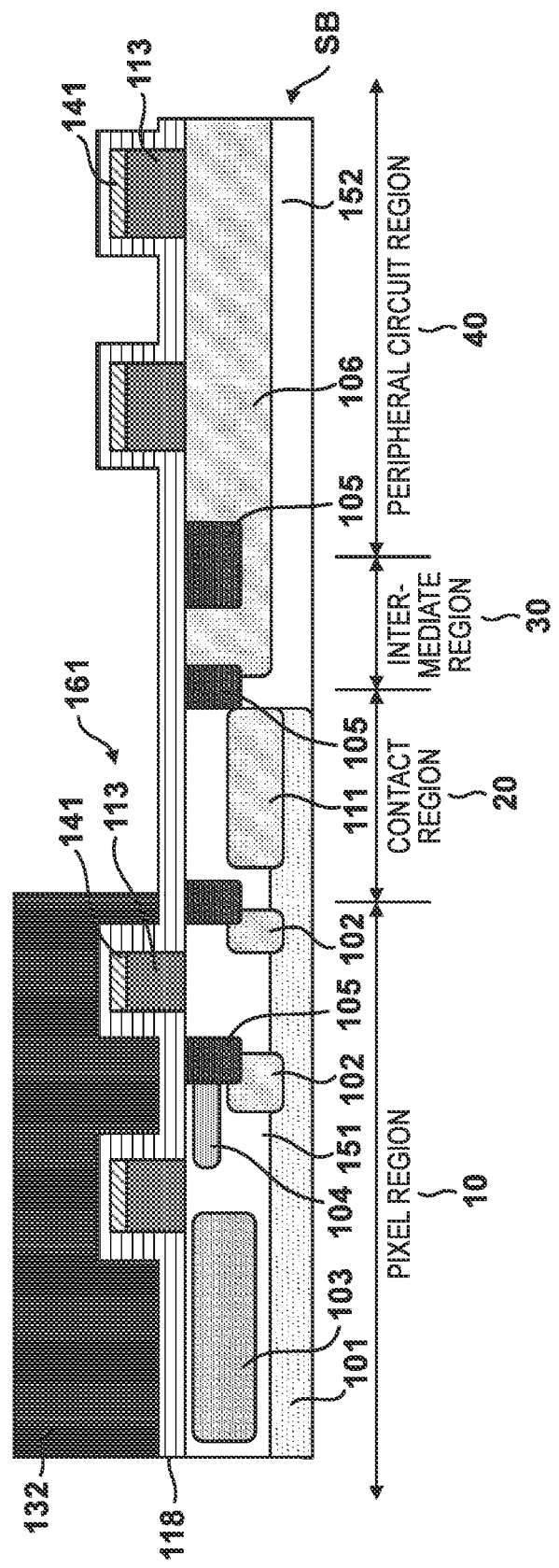

In a step shown in FIG. 3, an insulating film 118 is formed to cover the semiconductor substrate SB, polysilicon patterns 113, and insulating films 141. The insulating film 118 is preferably formed from a multilayered film of silicon oxide and silicon nitride. In the step shown in FIG. 3, a resist pattern 132 is formed to cover the insulating film 118 in the pixel region 10 and expose it in the contact region 20, intermediate region 30, and peripheral circuit region 40.

Figure 4:
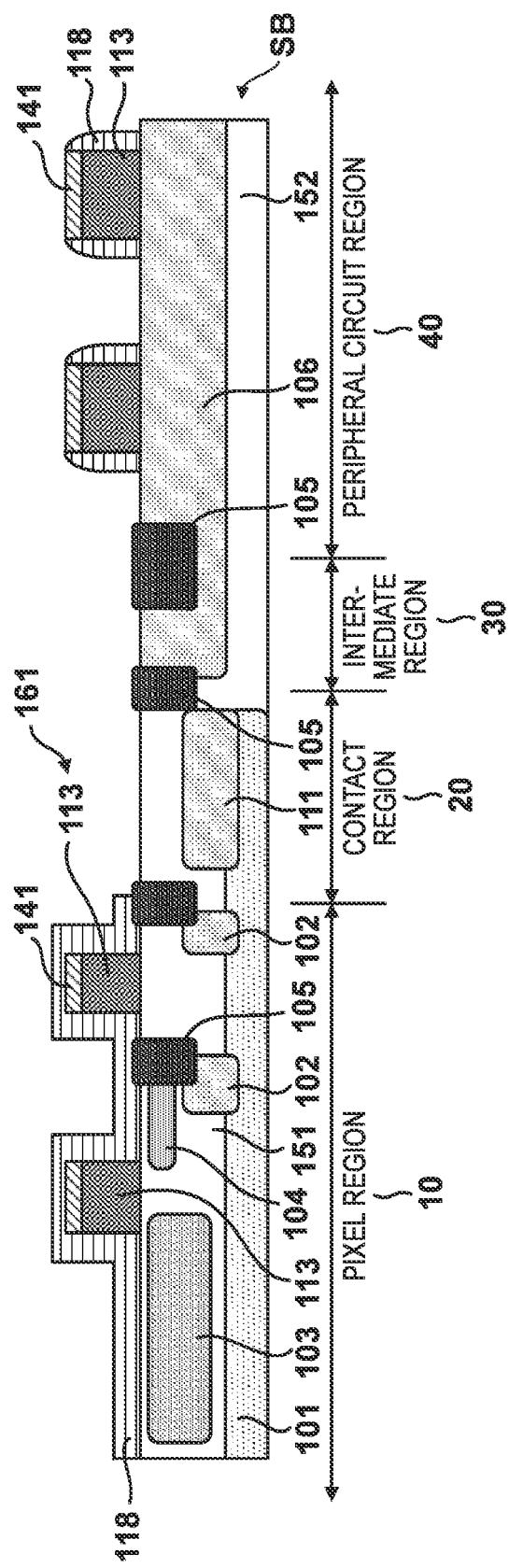

In a step shown in FIG. 4, the insulating film 118 in the contact region 20, intermediate region 30, and peripheral circuit region 40 is etched using the resist pattern 132 as an etching mask, and then the resist pattern 132 is removed. Accordingly, side spacers are formed from the insulating film 118 on the side surfaces of the polysilicon pattern 113 and insulating film 141 in the peripheral circuit region 40.

Figure 5:
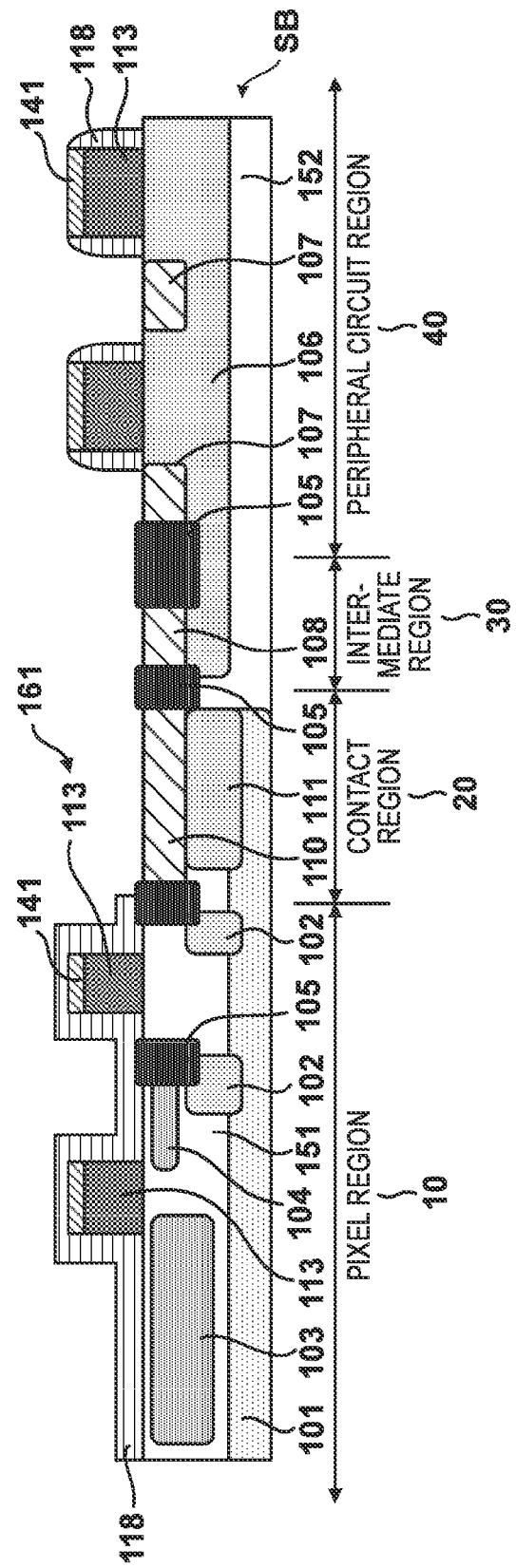

In a step shown in FIG. 5, impurity ions are implanted in a region above the semiconductor region 111 in the contact region 20, and the well 106 in the intermediate region 30 and peripheral circuit region 40, forming semiconductor regions 110, 108, and 107. When the semiconductor regions 110, 108, and 107 have different conductivity types, impurity ions of different conductivity types are separately formed using masks.

Figure 6:
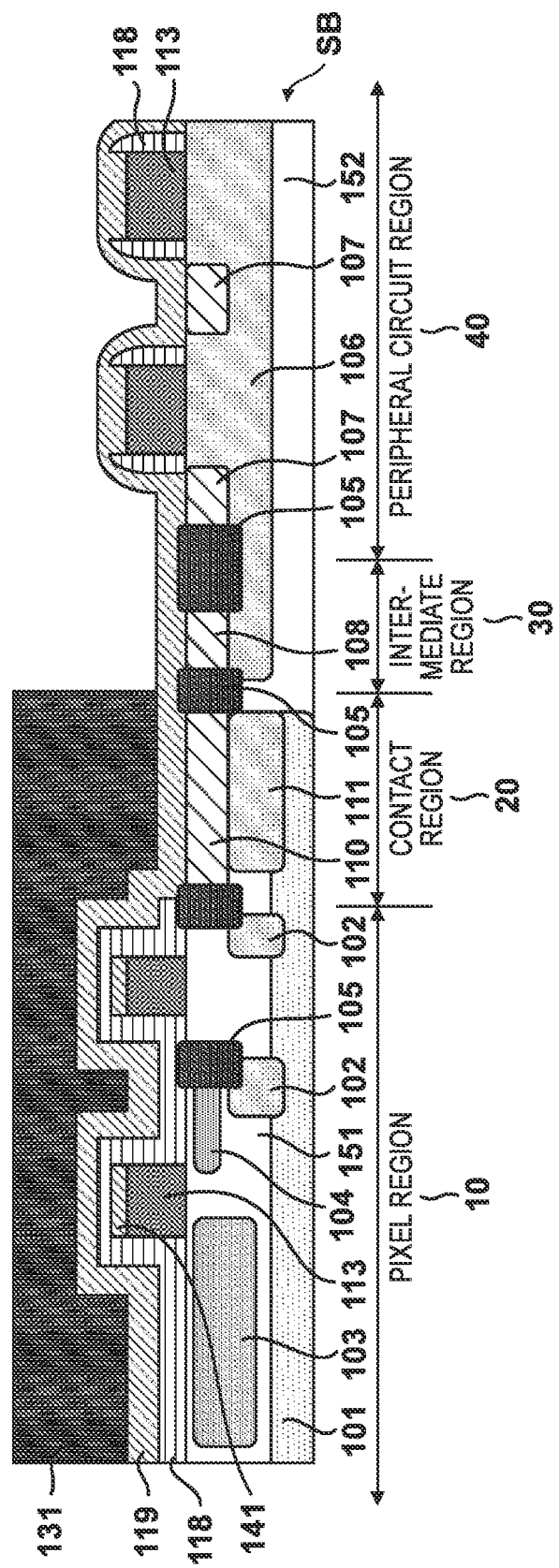

In a step shown in FIG. 6, an insulating film 119 is formed to cover a) the insulating film 118 in the pixel region 10, b) the active regions of the contact region 20, intermediate region 30, and peripheral circuit region 40, and c) a structure including the polysilicon patterns 113 in the peripheral circuit region 40. The insulating film 118 functions as an anti-silicidation film. The insulating film 119 can be, for example, a silicon oxide film. Then, a resist pattern 131 is formed to cover the insulating film 119 in the pixel region 10 and contact region 20, and expose it in the intermediate region 30 and peripheral circuit region 40.

Figure 7:
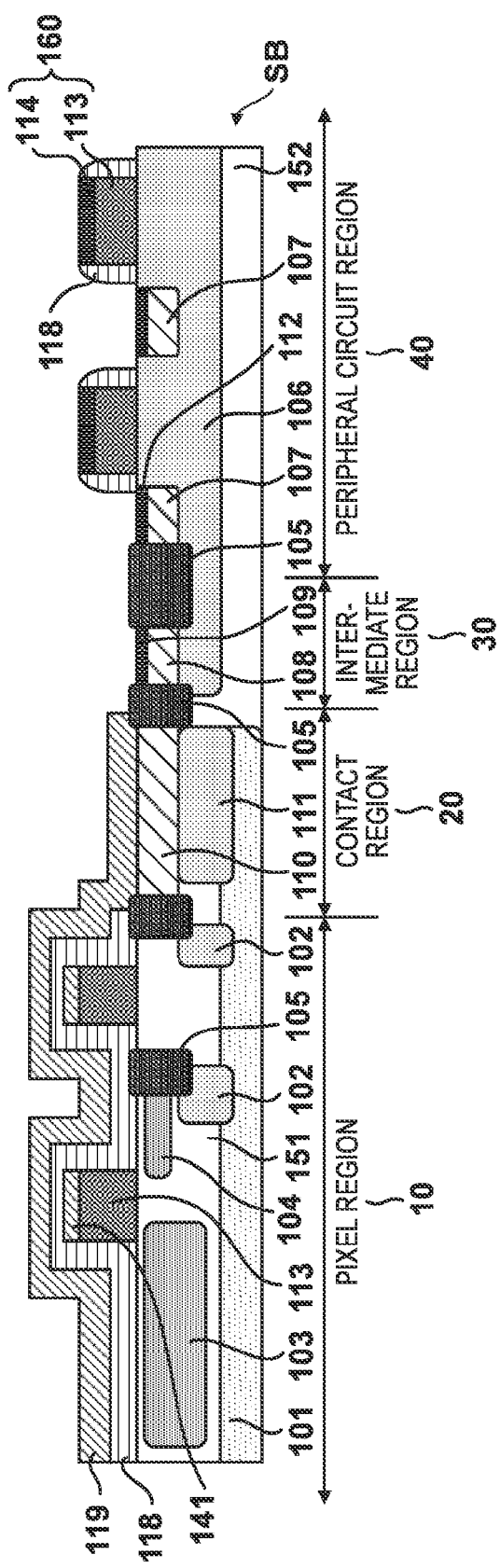

In a step shown in FIG. 7, the insulating film 119 in the intermediate region 30 and peripheral circuit region 40 is etched using the resist pattern 131 as an etching mask, and then the resist pattern 131 is removed. The surfaces of the exposed semiconductor regions 108 and 107 and polysilicon pattern 113 are silicided, forming silicide films 109, 112, and 114. An example of silicidation is as follows. First, a multilayered film of cobalt serving as a high melting point metal and titanium nitride serving as an anti-oxidant film for the high melting point metal is formed to cover the semiconductor regions 107 and 108 and polysilicon pattern 113. Examples of the high melting point metal are titanium, nickel, tungsten, molybdenum, tantalum, chromium, palladium, and platinum, in addition to cobalt. Examples of the anti-oxidant film for the high melting point metal are nickel and titanium, in addition to titanium nitride. Then, the multilayered film is annealed. By annealing, silicon forming the semiconductor regions 107 and 108 and polysilicon pattern 113, and the high melting point metal react with each other, forming silicide films 109, 112, and 114. After that, the multilayered film containing the unreacted high melting point metal is removed.

Figure 8:
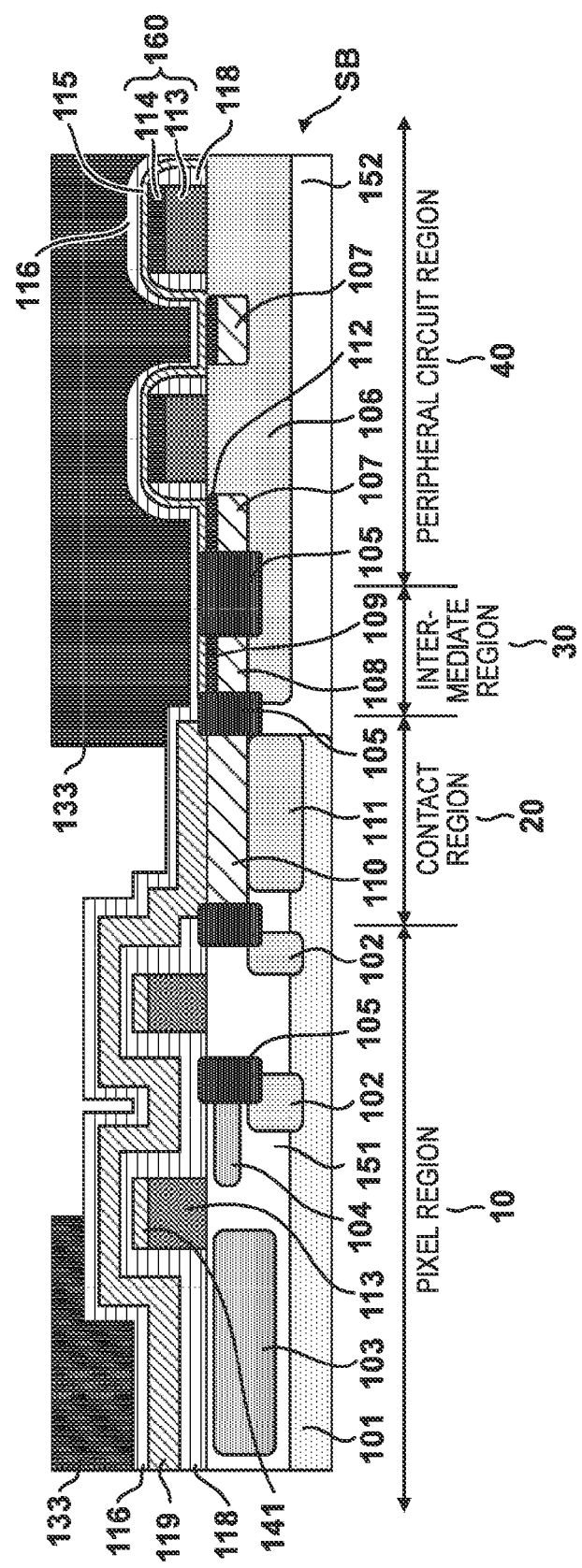

In a step shown in FIG. 8, an insulating film 115 is formed to cover the structure of the pixel region 10, contact region 20, intermediate region 30, and peripheral circuit region 40, and an etch stop film 116 is formed on the insulating film 115. Preferably, the insulating film 115 is made of silicon oxide, and the etch stop film 116 is made of silicon nitride. The insulating film 115 also extends to the pixel region. In the pixel region 10, the insulating film 115 is illustrated integrally with the insulating film 119 because the insulating film 115 is made of silicon oxide which is the same material as that of the insulating film 119. Thereafter, a resist pattern 133 is formed. The resist pattern 133 covers a region of the pixel region 10 where the semiconductor region 103 is formed, and the etch stop film 116 in the intermediate region 30 and peripheral circuit region 40, while exposing a region of the pixel region 10 where a MOS transistor is formed, and the contact region 20.

Figure 9:
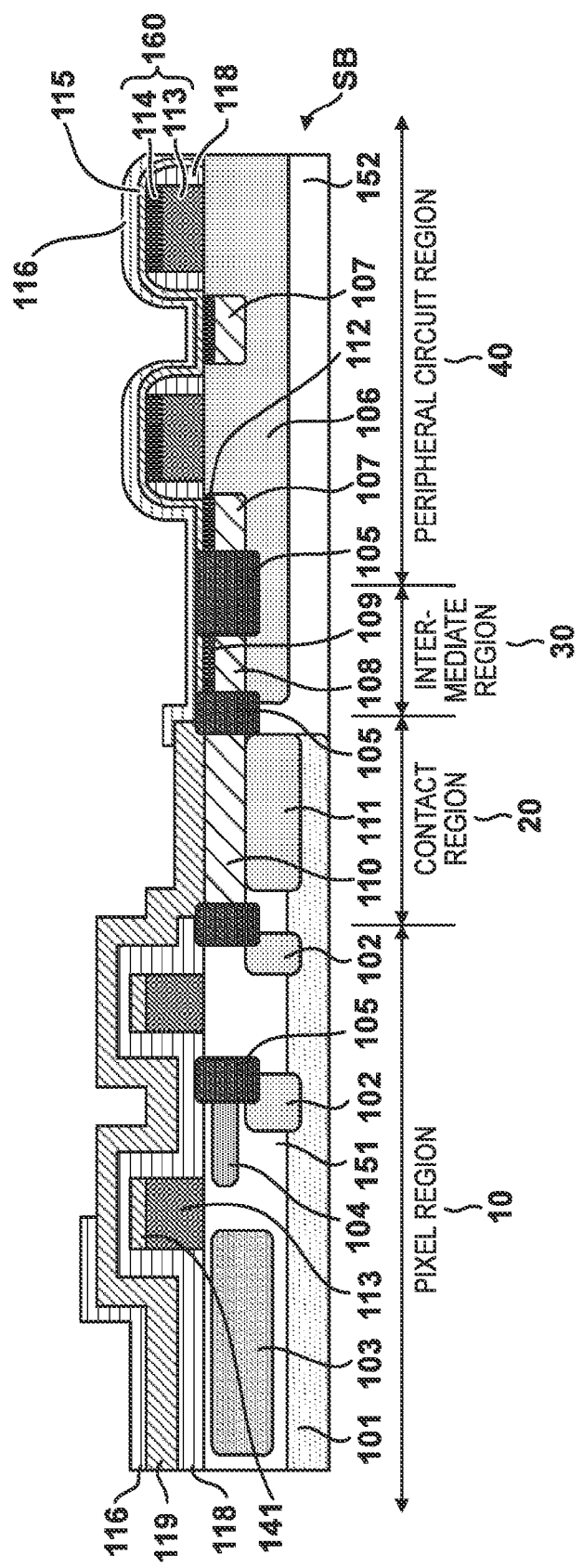

In a step shown in FIG. 9, the region of the pixel region 10 where a MOS transistor is formed, and the contact region 20 are etched using the resist pattern 133 as an etching mask, and then the resist pattern 133 is removed. As a result, the etch stop film 116 remains in a region of the pixel region 10 where the semiconductor region (photoelectric converter) 103 is formed, the intermediate region 30, and the peripheral circuit region 40. The insulating film 115 below the etch stop film 116 also remains. That is, the etch stop film 116 and insulating film 115 remain to cover the silicide film 109 in the intermediate region 30 and the silicide films 112 and 114 in the peripheral circuit region 40. This can prevent the silicide film 109 in the intermediate region 30 where the contact plug 117 is not formed, from peeling off and becoming a particle after the removal step of the etch stop film 116. Note that the etch stop film 116 in the peripheral circuit region 40 is used in etching for forming a contact hole.

Figure 16:
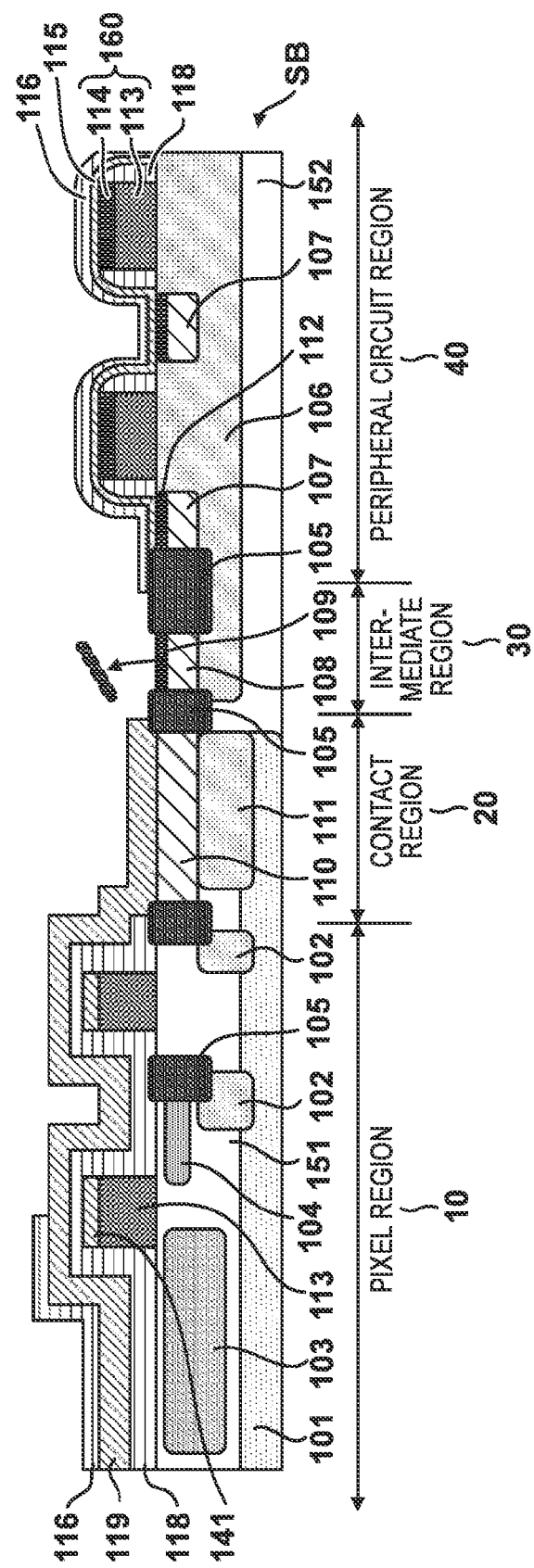
FIG. 16 is a sectional view showing a comparative example.

FIG. 16 is a view showing a comparative example. The comparative example shown in FIG. 16 schematically represents a state in which the etch stop film 116 and insulating film 115 in the intermediate region 30 are removed, and the silicide film 109 is exposed. In this state, the silicide film 109 readily peels off and becomes a particle. It is therefore important to cover the silicide film 109 in the intermediate region 30 with the etch stop film 116, as exemplified in FIG. 15.

Figure 10:
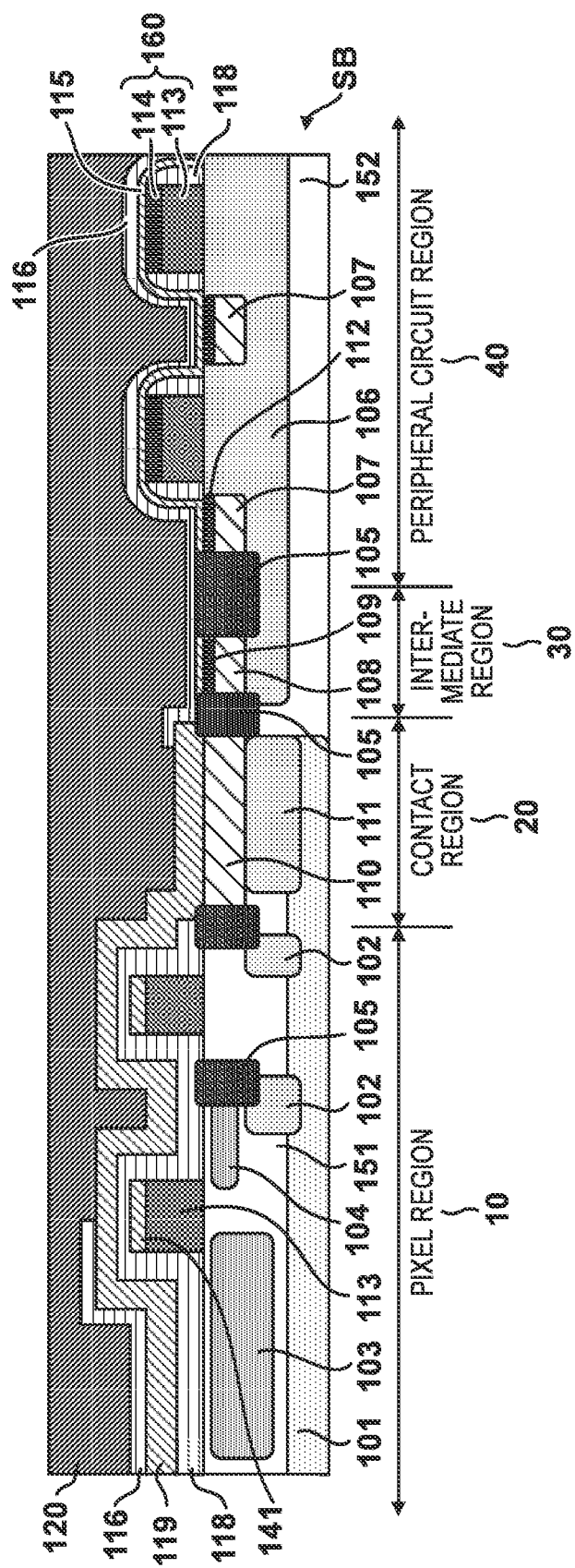

In a step shown in FIG. 10, an interlayer insulating film 120 is formed to cover the pixel region 10, contact region 20, intermediate region 30, and peripheral circuit region 40.

Figure 11:
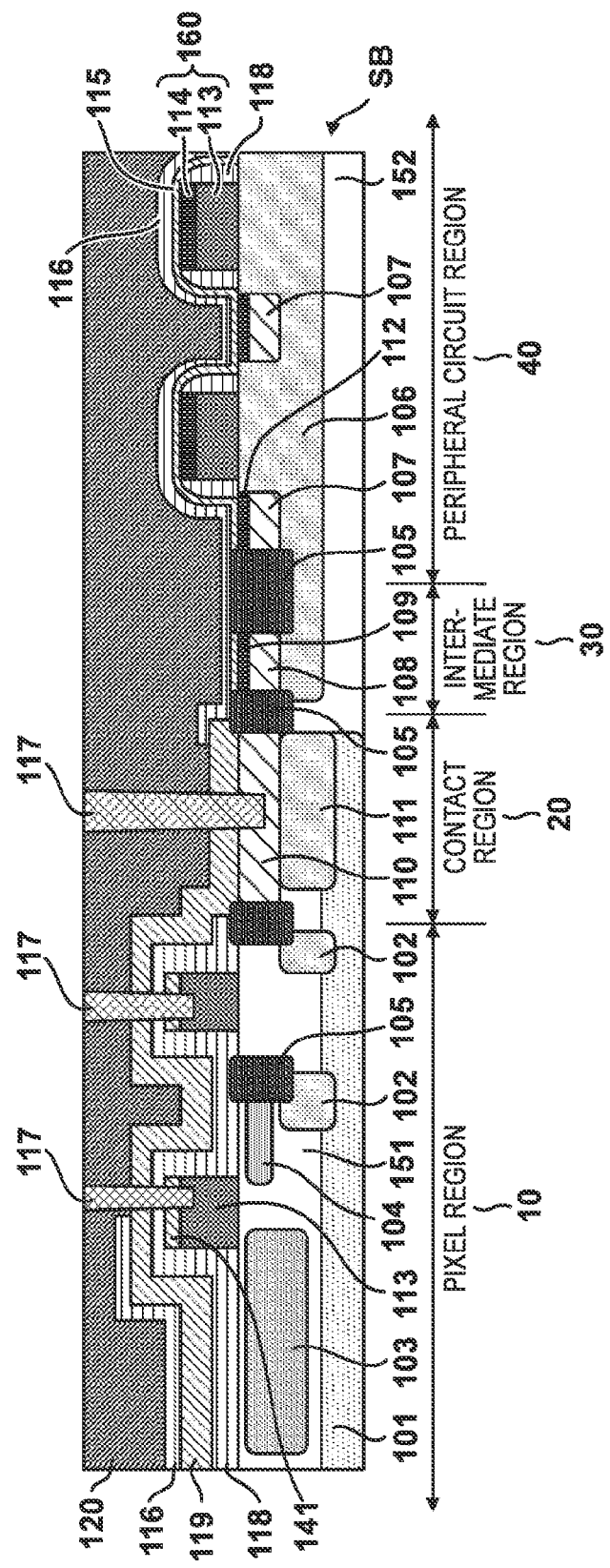

In a step shown in FIG. 11, contact plugs 117 are formed in the pixel region 10 and contact region 20. In a step shown in FIG. 12, contact plugs 117 are formed in the peripheral circuit region 40. At this time, the contact plugs 117 may be simultaneously formed in the pixel region 10, contact region 20, and peripheral circuit region 40.

An example of separately forming the contact plugs 117 in the pixel region 10 and contact region 20, and the contact plugs 117 in the peripheral circuit region 40 will be explained here. However, this does not limit the present invention. In the step shown in FIG. 11, openings are formed in the interlayer insulating film 120 and insulating film 119 in the pixel region 10 and contact region 20 so that etching stops at the insulating film 118, and then the insulating film 118 and insulating film 141 are etched through the openings, forming contact holes. At this time, the etch stop film 116 does not exist in the contact region 20, so a contact hole is formed deeper than in the pixel region 10 to reach the semiconductor region 110 in the semiconductor substrate SB. The contact holes are filled with a conductor, forming contact plugs 117.

Figure 12:
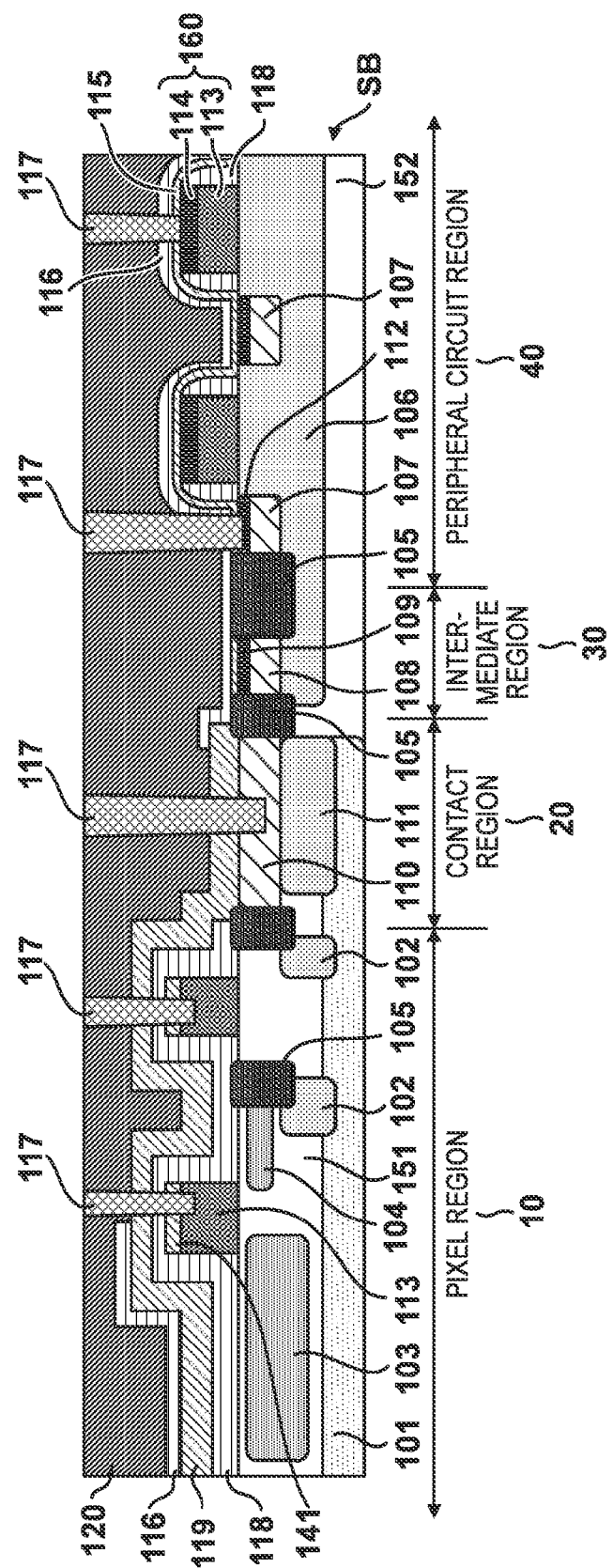

In the step shown in FIG. 12, openings are formed in the interlayer insulating film 120 in the peripheral circuit region 40 so that etching stops at the etch stop film 116, and then the etch stop film 116 and insulating film 115 are etched through the openings, forming contact holes. The contact holes are filled with a conductor, forming contact plugs 117.

Figure 13:
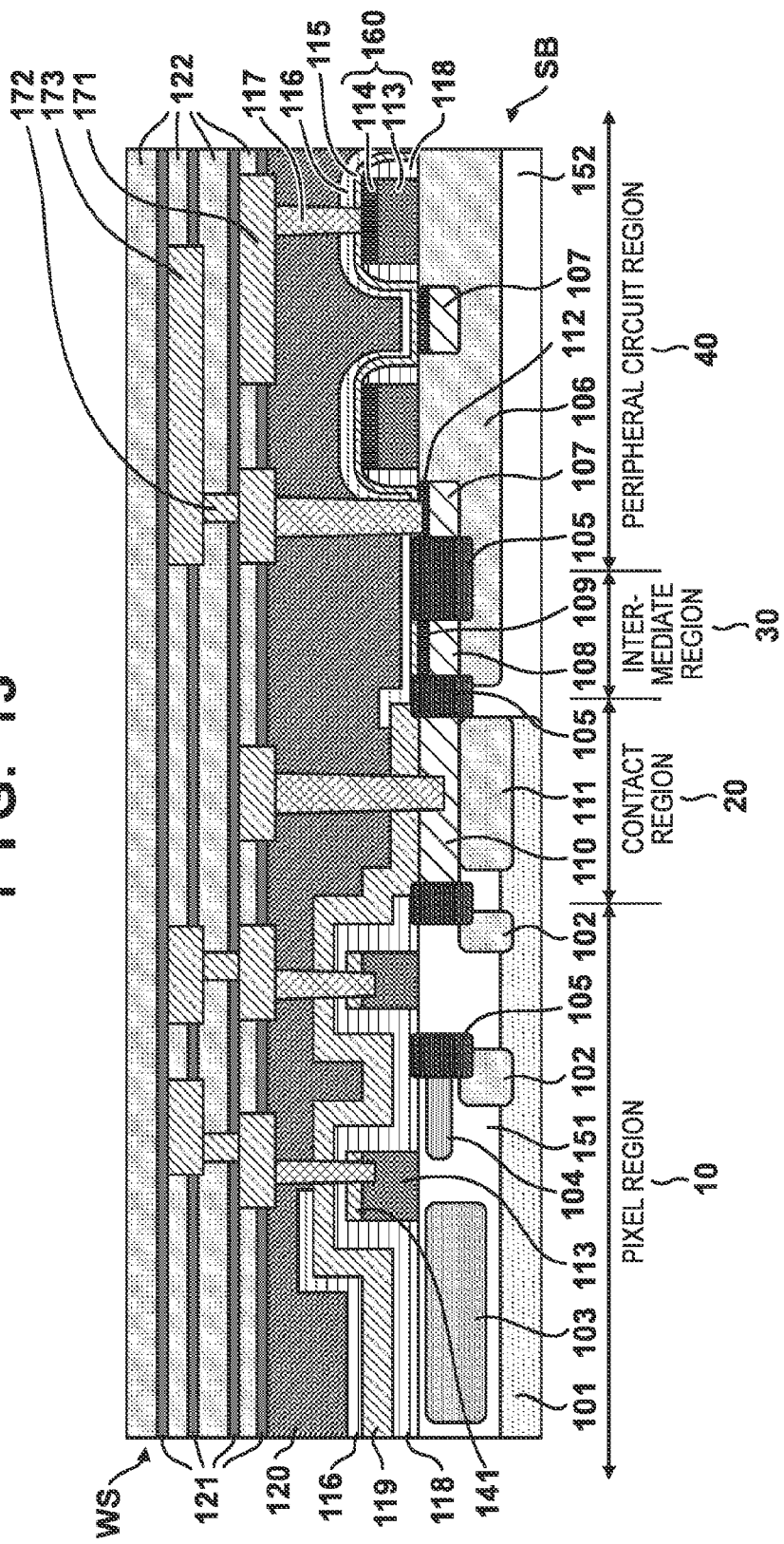

In a step shown in FIG. 13, a wiring structure WS is formed. In a step shown in FIG. 14, a lightguide 181 formed. In this step, a pattern of the etch stop film 116 that is arranged in the pixel region 10 is used as an etch stop film for forming a lightguide opening. As described above, a pattern of the etch stop film 116 that is arranged in the pixel region 10, and a pattern of the etch stop film 116 that is arranged in the peripheral circuit region 40 are formed in the same step, and can have the same thickness at flat portions.

More specifically, in the step shown in FIG. 14, a lightguide opening is formed by etching the wiring structure WS and interlayer insulating film 120 so that etching stops at a pattern of the etch stop film 116 that is arranged in the pixel region 10. The lightguide opening is then filled with an insulator, forming a lightguide 181. The insulator to be filled is preferably made of a material higher in refractive index than the interlayer insulating film 120. When filling the lightguide opening with the insulator, an insulating film 123 can be formed in a region other than the lightguide opening.

In a step shown in FIG. 15, a microlens layer 130 including the insulating film 123, an insulating film 125 including an intra-layer lens 182, a planarizing film 126, color filters 127 and 128, and a microlens 129 is formed. As a result, a solid-state image sensor is obtained.

As an application example of the solid-state image sensor according to the embodiment, a camera which incorporates the solid-state image sensor will be exemplified. The concept of the camera is not limited to an apparatus whose main purpose is image capturing, but also includes an apparatus (for example, a personal computer or mobile terminal) accessorily having the image capturing function. The camera includes the solid-state image sensor according to the present invention exemplified as the embodiment, and a processor which processes a signal output from the solid-state image sensor. The processor can include, for example, an A/D converter, and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:
1. A solid-state image sensor comprising:
   a pixel region including a first active region;
   a peripheral circuit region including a second active region;
   an intermediate region including a third active region and arranged between the pixel region and the peripheral circuit region;
   a first element isolation arranged between the first active region and the third active region;
   a second element isolation arranged between the second active region and the third active region;
   a metal compound layer provided in the second active region and the third active region;
   an interlayer insulating film that covers the first active region, the second active region, and the third active region;

a first film arranged between the first active region and the interlayer insulating film;

a second film arranged between the second active region and the interlayer insulating film;

a first contact plug arranged on the first active region through the interlayer insulating film and the first film;

a second contact plug arranged on the second active region through the interlayer insulating film and the second film, the second contact plug contacting the metal compound layer in the second active region, wherein the second film is arranged between the metal compound layer in the third active region and the interlayer insulating film such that the interlayer insulating film does not contact the metal compound layer in the third active region.

2. The sensor according to claim 1, wherein the metal compound layer is made of a silicide.

3. The sensor according to claim 1, wherein the second film is made of silicon nitride.

4. The sensor according to claim 1, wherein the third active region is arranged to surround the first active region.

5. The sensor according to claim 1, wherein no contact plug contacts the third active region.

6. The sensor according to claim 1, wherein no circuit element is provided with the third active region.

7. The sensor according to claim 1, wherein the second film is not arranged above a part of the first active region.

8. The sensor according to claim 1, further comprising:
a contact region including a fourth active region and arranged between the pixel region and the intermediate region;
a third element isolation arranged between the third active region and the fourth active region; and
a third contact plug arranged on the fourth active region through the first film and the interlayer insulating film.

9. The sensor according to claim 8, wherein the metal compound layer is a silicide layer of cobalt, and no silicide layer of cobalt is provided to the fourth active region.

10. The sensor according to claim 8, wherein the fourth active region is arranged to surround the first active region.

11. A camera comprising:
a solid-state image sensor defined in claim 1; and
a processor which processes a signal output from the solid-state image sensor.

12. The sensor according to claim 1, wherein the second film does not extend from the peripheral circuit region to the pixel region through the intermediate region.

13. A solid-state image sensor comprising:
a first active region in a pixel region;
a second active region in a peripheral circuit region;
a third active region arranged between the pixel region and the peripheral circuit region;
a fourth active region arranged between the pixel region and the peripheral circuit region;
a first element isolation arranged between the first active region and the fourth active region;
a second element isolation arranged between the second active region and the third active region;
a third element isolation arranged between the third active region and the fourth active region;
a metal compound layer provided in the second active region and the third active region;
an interlayer insulating film that covers the first active region, the second active region and the third active region;
a first film arranged between the first active region and the interlayer insulating film;
a second film arranged between the second active region and the interlayer insulating film;
a first contact plug arranged on the first active region through the interlayer insulating film and the first film;
a second contact plug arranged on the second active region through interlayer insulating film and the second film, the second contact plug contacting the metal compound layer in the second active region through the interlayer insulating film and the second film; and
a third contact plug contacting the fourth active region through the interlayer insulating film and the first film,
wherein the second film extends such that a part of the second film overlaps with the first film.

14. A camera comprising:
a solid-state image sensor defined in claim 13; and
a processor which processes a signal output from the solid-state image sensor.

15. The sensor according to claim 13, wherein the second film is made of silicon nitride.

16. The sensor according to claim 13, wherein the first film is made of silicon oxide.

17. The sensor according to claim 13, wherein the second film overlaps with the first film on the third element isolation.

18. The sensor according to claim 13, wherein a third film is arranged between the first film and the first active region, and the first contact plug is arranged on the first active region through the interlayer insulating film, the first film, and the third film.

19. The sensor according to claim 17, wherein the third film is made of silicon nitride.

20. The sensor according to claim 18, wherein the second film extends such that the second film does not overlap with the third film above a region between the first active region and the second active region.

* * * * *